(12) United States Patent
Muraoka et al.

(10) Patent No.: US 12,186,786 B2
(45) Date of Patent: Jan. 7, 2025

(54) METHOD FOR TREATING WASTE ELECTRONIC SUBSTRATE

(71) Applicant: MITSUBISHI MATERIALS CORPORATION, Tokyo (JP)

(72) Inventors: Shu Muraoka, Kagawa-gun (JP); Hiroshi Hayashi, Tokyo (JP); Shota Nakayama, Iwaki (JP); Yusuke Kimura, Kagawa-gun (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 726 days.

(21) Appl. No.: 17/422,765

(22) PCT Filed: Feb. 21, 2020

(86) PCT No.: PCT/JP2020/006981
§ 371 (c)(1),
(2) Date: Jul. 14, 2021

(87) PCT Pub. No.: WO2020/175350
PCT Pub. Date: Sep. 3, 2020

(65) Prior Publication Data
US 2022/0062962 A1 Mar. 3, 2022

(30) Foreign Application Priority Data
Feb. 28, 2019 (JP) ................. 2019-035626

(51) Int. Cl.
*B09B 3/25* (2022.01)
*B02C 18/00* (2006.01)
(Continued)

(52) U.S. Cl.
CPC ............ *B09B 3/25* (2022.01); *B02C 18/0084* (2013.01); *B02C 23/08* (2013.01); *B07C 5/06* (2013.01);
(Continued)

(58) Field of Classification Search
CPC ........ B09B 2101/17; B09B 3/25; B02C 23/08
See application file for complete search history.

(56) References Cited

U.S. PATENT DOCUMENTS
2001/0030251 A1 10/2001 Ueno et al.

FOREIGN PATENT DOCUMENTS
CN 1181711 A 5/1998
CN 1115210 C * 7/2003 ............. B03B 9/061
(Continued)

OTHER PUBLICATIONS

Kumagai, S., et al. Thermal decomposition of tetrabromobisphenol-A containing printed circuit boards in the presence of calcium hydroxide. J Mater Cycles Waste Manag 19, 282-293 (2017) (Year: 2017).*
(Continued)

*Primary Examiner* — Daniel Berns
*Assistant Examiner* — Eric Scott Sherman
(74) *Attorney, Agent, or Firm* — Locke Lord LLP; James E. Armstrong, IV; Nicholas J. DeCeglie, Jr.

(57) ABSTRACT

A method for treating waste printed circuit board includes carbonizing waste printed circuit board together with a calcium compound at 400° C. to 600° C. in a non-oxidizing atmosphere to fix a halogen contained in the board as calcium halide and to melt a solder of the board to allow mounted parts to be easily separated from the board, performing crushing after the carbonizing, and sieving crushed materials into fine particles of less than 0.5 mm containing the calcium compounds, medium particles containing the mounted parts, and coarse particles containing board pieces such that the crushed materials are sorted into the calcium compounds, the mounted parts, and the board pieces.

4 Claims, 1 Drawing Sheet

(51) Int. Cl.
    *B02C 23/08*     (2006.01)
    *B07C 5/06*     (2006.01)
    *B07C 5/342*     (2006.01)
    *B07C 5/344*     (2006.01)
    *B09B 3/40*     (2022.01)
    *B09B 101/17*     (2022.01)
    *H05K 3/22*     (2006.01)

(52) U.S. Cl.
    CPC .............. *B07C 5/342* (2013.01); *B07C 5/344* (2013.01); *B09B 3/40* (2022.01); *H05K 3/22* (2013.01); *B09B 2101/17* (2022.01); *H05K 2203/178* (2013.01)

(56) References Cited

FOREIGN PATENT DOCUMENTS

| | | | |
|---|---|---|---|
| CN | 108031702 A | 5/2018 | |
| JP | 102-218486 A | 8/1990 | |
| JP | H06-256863 A | 9/1994 | |
| JP | H08-290147 A | 11/1996 | |
| JP | H08-290148 A | 11/1996 | |
| JP | H11-034058 A | 2/1999 | |
| JP | H11-076980 A | 3/1999 | |
| JP | H11-188335 A | 7/1999 | |
| JP | 2000-219921 A | 8/2000 | |
| JP | 2000-301131 A | 10/2000 | |
| JP | 2001-198561 A | 7/2001 | |
| JP | 2004-267987 A | 9/2004 | |
| JP | 2008-194618 A | 8/2008 | |
| JP | 2008-290147 A | 12/2008 | |
| JP | 2009-226302 A | 10/2009 | |
| JP | 4465859 B2 * | 5/2010 | ............. B02C 13/22 |
| JP | 2012-086118 A | 5/2012 | |
| JP | 2018167246 * | 11/2018 | ............... B09B 3/00 |
| JP | 2019-123771 A | 7/2019 | |
| KR | 10-2011-0037056 A | 4/2011 | |
| WO | 2019/151351 A1 | 8/2019 | |

OTHER PUBLICATIONS

Office Action mailed Sep. 15, 2022, issued for Inida Patent Application No. 202117031631.
International Search Report mailed Apr. 21, 2020, issued for PCT/JP2020/006981 and English translation thereof.
Office Action mailed Jul. 1, 2022, issued for Chinese Patent Application No. 202080009871.3 and English translation thereof.
Zhou Wenxian et al., "Study on copyrolysis and dehalogenation of waste printed circuit boards and calcium carbonate", Chinese Journal of Environmental Engineering, vol. 3, No. 1, Jan. 31, 2009, pp. 169-174 and English abstract thereof. (cited in the Oct. 5, 2022 Search Report issued for EP20762506.2).
Supplementary European Search Report mailed Oct. 5, 2022, issued for European patent application No. 20762506.2.

* cited by examiner

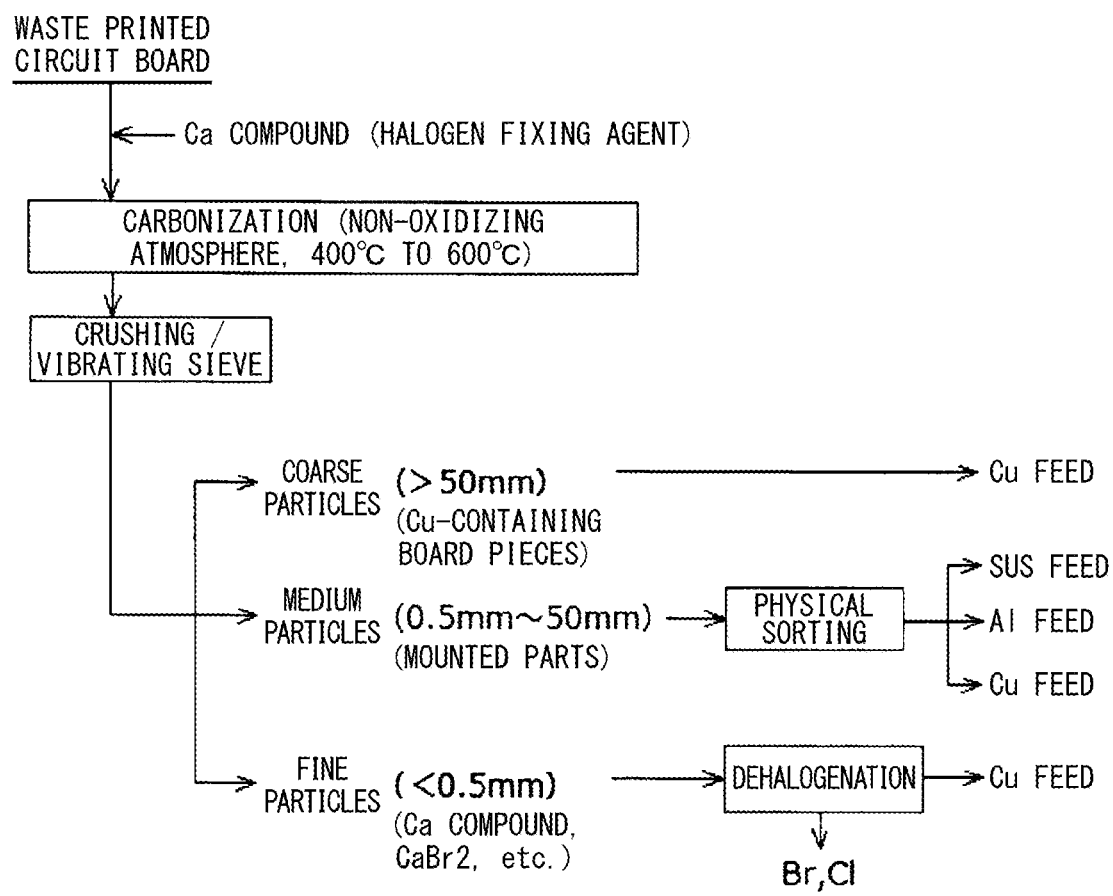

METHOD FOR TREATING WASTE ELECTRONIC SUBSTRATE

TECHNICAL FIELD

The present invention relates to a treating method for removing combustibles or halogens from waste printed circuit board (print board waste) without causing environmental pollution, and efficiently sorting a metal such as aluminum and stainless steel (SUS) that adversely affect a copper refining process to use a treated material of the waste printed circuit board as a copper feed.

Priority is claimed on Japanese Patent Application No. 2019-035626, filed Feb. 28, 2019, the content of which is incorporated herein by reference.

BACKGROUND ART

The electronic board is used in various fields such as a home appliance, an automobile, and a portable electronic device. Since the electronic board contains a valuable metal such as gold, silver, copper, platinum, and palladium, the wasted electronic board is required to recover the valuable metal as a resource. However, there is a problem that a resin portion of the electronic board contains halogens such as bromine and chlorine, and in a case in which the waste printed circuit board is subjected to the heat treatment in an oxidizing atmosphere, harmful dioxin is generated, and the generated halogen-containing gas corrodes the device materials.

In addition, the electronic board includes SUS or aluminum mounted parts (electronic components mainly attached on the board by solder), chromium and aluminum contained in these mounted parts are elements that adversely affect the copper refining process, and thus it is not preferable to directly put the waste printed circuit board into the copper refining process and treat the waste printed circuit board. Therefore, in order to treat the waste printed circuit board by using the copper refining process, pretreatment is required to remove the halogens and the combustibles contained in the resin, and to perform sorting into a SUS-based material or an aluminum-based material and remove the materials.

As a pretreatment technique for the waste printed circuit board, for example, Patent Document 1 (Japanese Unexamined Patent Application, First Publication No. H06-256863) discloses that the waste printed circuit board is heated to 500° C. to 1000° C. in a non-oxidizing atmosphere and subjected to the carbonization treatment, and then the exhaust gas is treated by the exhaust gas treatment equipment made of a material that is resistant to corrosion due to the halogens. However, it is difficult to sufficiently prevent corrosion of a furnace body due to the halogen-containing gas, and in a case in which the material that is resistant to corrosion, such as Inconel, is used, the cost of the treatment equipment is very high. Further, there is a problem that in a case in which aluminum is heated to 660° C. or higher, aluminum melts, so that it is difficult to perform sorting into the mounted parts attached to the board.

Patent Document 2 (Japanese Unexamined Patent Publication No. 2001-198561) discloses a treating method in which the waste printed circuit board is carbonized at 300° C. to 1000° C., and the carbonization gas containing the generated bromine gas is thermally decomposed again at a low temperature (180° C. to 300° C.), hydrogen bromide (HBr) is recovered. However, in a case in which the carbonization gas of the waste printed circuit board is cooled to 180° C. to 300° C., the decomposed resin content is liquefied into a tar form, and Br remains in the tar, which complicates the post-treatment. In addition, there is a problem that the pipe is blocked due to tar, which makes the operation difficult.

Patent Document 3 (Japanese Unexamined Patent Application, First Publication No. 2000-301131) discloses a treating method in which the waste printed circuit board is subjected to the carbonization treatment at 250° C. to 500° C., then is crushed and pulverized, and the resin content and the metal content are separated by using the difference in specific gravity and particle size thereof. However, in a case in which the waste printed circuit board is carbonized as it is, the problem of halogen generation cannot be avoided, and the metal portion of the mounted parts is scraped together with the board portion by crushing and pulverization, so that a part of the metal may be pulverized. The powdered metal is mixed with the pulverized resin material, and thus there is a problem that the recovery rate of the metal is lowered.

CITATION LIST

Patent Documents

[Patent Document 1]
  Japanese Unexamined Patent Application, First Publication No. H06-256863 (A)
[Patent Document 2]
  Japanese Unexamined Patent Application, First Publication No. 2001-198561 (A)
[Patent Document 3]
  Japanese Unexamined Patent Application, First Publication No. 2000-301131 (A)

SUMMARY OF INVENTION

Technical Problem

The present invention solves the problems described above in the method for treating the waste printed circuit board in the related art, and is to provide a treating method in which generation of the harmful halogen-containing gas is avoided, combustibles or halogens are removed without causing environmental pollution, and a metal such as aluminum and SUS that adversely affect a copper refining process is sorted to use a treated material of the waste printed circuit board as a copper feed.

Solution to Problem

The present invention includes the aspects as follows.

(1) A method for treating an waste printed circuit board, the method including carbonizing waste printed circuit board together with a calcium compound at 400° C. to 600° C. in a non-oxidizing atmosphere to fix a halogen contained in the board as calcium halide and to melt a solder of the board to allow mounted parts to be easily separated from the board, performing crushing after the carbonizing, and sieving crushed materials into fine particles of less than 0.5 mm containing the calcium compounds, medium particles containing the mounted parts, and coarse particles containing board pieces such that the crushed materials are sorted into the calcium compounds, the mounted parts, and the board pieces.

(2) The method for treating waste printed circuit board according to (1), in which the crushed materials are sieved into the fine particles of less than 0.5 mm containing the calcium compounds, medium particles of 0.5 mm or more and 50 mm or less containing the mounted parts, and coarse particles of more than 50 mm containing the board pieces.

(3) The method for treating waste printed circuit board according to claim (1) or (2), further including physically sorting the medium particles containing the mounted parts by any one of magnetic force sorting, eddy current sorting, and color sorting or a combination thereof into a SUS-based material and an aluminum-based material.

(4) The method for treating waste printed circuit board according to any one of (1) to (3), in which after washing the fine particles containing the calcium compounds with water to remove the halogen, the fine particles are reused as the calcium compounds during carbonizing or used as a copper feed.

(5) The method for treating waste printed circuit board according to any one of (1) to (4), in which a remaining material excluding a SUS-based material and an aluminum-based material sorted by physical sorting of the medium particles containing the mounted parts is used as a copper feed.

(Since it seems to be a more appropriate description location, the description in paragraphs 0010 to 0021 has been moved to [Description of Embodiments].)

Advantageous Effects of Invention

In the treating method according to the present invention, the waste printed circuit board is carbonized together with the calcium compound in a case of the carbonization treatment, so that the calcium compound acts as a halogen fixing agent and reacts with the halogen-containing gas such as bromine or chlorine generated by thermal decomposition of the board to generate and fix an inorganic solid compound such as calcium halide. By such halogen fixing, the generation of a bromine gas or a chlorine gas is significantly reduced, so that corrosion of the furnace body and exhaust gas treatment equipment is suppressed. Further, since the treatment is performed in the non-oxidizing atmosphere, the generation of dioxin is suppressed in addition to suppressing the generation of the halogen-containing gas. Further, the recovered calcium halide or the like can be washed with water to remove the halogen, and thus it can be washed with water and reused for treating the waste printed circuit board.

Since the solder of the board waste after the carbonization treatment melts, the mounted parts can be easily separated from the board only by applying vibration. Therefore, it is not necessary to finely pulverize the board waste after the carbonization treatment, or the number of times of pulverization can be minimized. As a result, the valuable metal can be recovered in high yield without loss.

The mounted parts separated from the board contain a SUS-based material or an aluminum-based material, which can be sorted by using magnetic force sorting, eddy current sorting, or color sorting, and can be efficiently recovered. Further, since the board portion and the mounted parts have good separability and the SUS-based material and the aluminum-based material can be efficiently removed from the mounted parts, the crushed material from which these materials are removed can be used as a copper raw material.

BRIEF DESCRIPTION OF DRAWINGS

FIG. 1 is a process chart showing an example of a treating method according to the present invention.

DESCRIPTION OF EMBODIMENTS

Specific Description

A treating method according to the present invention is a method for treating waste printed circuit board including carbonizing waste printed circuit board together with a calcium compound at 400° C. to 600° C. in a non-oxidizing atmosphere to fix a halogen contained in the board as calcium halide to melt a solder of the board to allow mounted parts to be easily separated from the board, performing crushing after the carbonizing to obtain crushed materials, sieving the crushed materials into fine particles of less than 0.5 mm containing the calcium compounds, medium particles containing the mounted parts, and coarse particles containing board pieces such that the crushed materials are sorted into the calcium compounds, the mounted parts, and the board pieces.

"Crushing" (disintegrate) refers to an operation in which mechanical energy is applied to a solid (aggregate) in which various materials are composited to break the bond between the materials. Crushing differs from "pulverizing" in which the size of each material is reduced while a new surface of the solid is generated in that crushing involves almost no generation of a new surface of the solid.

By carbonizing the waste printed circuit board under the above conditions and then appropriately crushing the waste printed circuit board, a group of the crushed materials having a size depending on the material can be obtained.

"Containing a calcium compound" means that the particles after crushing contain 30% by mass or more of calcium.

An outline of the treating method according to the present invention is shown in FIG. 1.

In the treating method according to the present invention, the waste printed circuit board is carbonized together with a calcium compound at 400° C. to 600° C. in the non-oxidizing atmosphere, a halogen contained in the board are fixed as calcium halide, and the solder of the board melts to allow the mounted parts (electronic components or the like) to be easily separated from the board.

As the calcium compound, slaked lime, quick lime, calcium carbonate, or the like can be used. This calcium compound acts as a halogen fixing agent and reacts with a halogen gas, such as a bromine gas or a chlorine gas, generated by carbonizing the board to generate calcium halide such as calcium bromide ($CaBr_2$), calcium chloride ($CaCl_2$)), or calcium chloride hydroxide (CaClOH) to fix the halogens.

An addition amount of the calcium compounds is preferably 1:0.05 or more, more preferably 1:0.5 or more in terms of weight ratio with respect to the board. In a case in which the addition amount of the calcium compounds is 1:0.5 or more with respect to the weight of the board, a Br removal rate of 80% or more can be obtained.

Although not particularly limited, the upper limit value of the addition amount of the calcium compounds is preferably 1:1.5 or less in terms of weight ratio from the viewpoint of economy.

The non-oxidizing atmosphere is, for example, a nitrogen atmosphere, a carbon dioxide gas atmosphere, or a superheated steam atmosphere. In a case in which combustion is performed in an oxidizing atmosphere such as an atmospheric air, a metal of the mounted parts and a metal such as aluminum and copper contained in the board are oxidized, so that the metal cannot be recovered as it is.

A carbonization temperature is preferably 400° C. to 600° C. At the temperature lower than 400° C., the solder that fixes the mounted parts to the board does not completely melt, which makes it difficult to separate the mounted parts from the board. In addition, an epoxy resin used for the board portion of the electronic board is not sufficiently decomposed, which makes it difficult to perform crushing of the subsequent stage. On the other hand, in a case in which the carbonization temperature is higher than 600° C., there is a concern that the temperature of the treated material exceeds a melting point (660° C.) of aluminum, and in that case, aluminum contained in the mounted parts melts, and the board and the mounted part are melt, which makes it difficult to separate the mounted parts from the board. By performing carbonization in the above temperature range, the solder that fixes the mounted parts to the board can melt to allow the mounted parts to be separated from the board and easily sorted, and the combustibles such as a resin component of the board can be thermally decomposed.

Although not particularly limited, the carbonization temperature is more preferably 450° C. to 580° C., and still more preferably 500° C. to 550° C.

As a carbonization device, for example, a heating device that can maintain the inside of the furnace, such as an externally heated rotary kiln, a stationary furnace, or a fluidized bed furnace, in the non-oxidizing atmosphere may be used. Further, a combustible gas generated during carbonizing has a very low halogen concentration, and thus it can be used as it is as a fuel gas. For example, the heat generated in a case in which the gas generated in the carbonization treatment is combusted can be used as a heating source of the carbonization device, and thus the heat energy required for the carbonization treatment can be supplied by self-combustion.

The waste printed circuit board is crushed after the carbonizing to obtain the crushed materials, and the crushed materials are sieved into the fine particles of less than 0.5 mm containing the calcium compounds, the medium particles containing the mounted parts, and the coarse particles containing board pieces such that the crushed materials are sorted into the calcium compounds, the mounted parts, and the board pieces. Specifically, for example, the crushed materials are sieved into the fine particles of less than 0.5 mm, the medium particles of 0.5 mm or more and 50 mm or less, and the coarse particles of more than 50 mm such that the crushed materials are sorted into the calcium compounds contained in the fine particles, the mounted parts contained in the medium particles, and the board pieces contained in the coarse particles. Since the calcium compounds are the fine particles having a size of less than 0.5 mm, the calcium compounds can be sorted by crushing to a size of less than 0.5 mm.

As for the ranges of the medium particles and the coarse particles, the particle size range for crushing need only be determined depending on the size of the board or the mounted part. For example, as for the board having the mounted parts having a typical size, in a case in which it is sieved into the medium particles of 0.5 mm or more and 50 mm or less and the coarse particles of more than 50 mm, the mounted parts contained in the medium particles and the board pieces contained in the coarse particles can be sorted.

The carbonized material generated by the carbonization treatment is brittle due to the carbonized resin of the board, and the mounted parts are also separated from the board, so that it can be easily crushed by applying vibration. Since the crushed materials are divided into sizes depending on its main components, and sieved into, for example, the fine particles of less than 0.5 mm, the medium particles of 0.5 mm or more and 50 mm or less, and the coarse particles of more than 50 mm by using a vibrating sieve or the like.

The calcium halide generated by carbonization and the unreacted calcium compound added during carbonizing are mainly fine grains of less than 0.5 mm, while the mounted parts separated from the board are mainly the medium particles of 0.5 mm or more and 50 mm or less, and the board pieces are the coarse particles of more than 50 mm. Therefore, by sieving the crushed materials into the fine particles of less than 0.5 mm, the medium particles of 0.5 mm or more and 50 mm or less, and the coarse particles of more than 50 mm, the crushed materials can be sorted into the calcium compounds, the mounted parts, and the board pieces.

The SUS-based material and the aluminum-based material can be sorted by physically sorting the sieved and recovered mounted parts by any one of sorting methods such as magnetic force sorting, eddy current sorting, and color sorting or a combination thereof. Since SUS and aluminum adversely affect the copper refining process, by sorting and removing the SUS-based material and the aluminum-based material, the crushed materials after the carbonizing can be used as a copper feed. Specifically, for example, since a copper plate, a copper circuit, or the like is embedded in the board, crushed pieces of the board can be used as the copper raw materials. Further, since the copper circuit or the like is incorporated in the electronic components of the mounted parts, the crushed pieces of the mounted parts can be used as the copper feed by sorting and removing the SUS-based material and the aluminum-based material.

In the specification of the present application, the SUS-based material (stainless steel-containing material) and the aluminum-based material (aluminum-containing material) are particles having a certain composition among the particles (coarse particles, medium particles, and fine particles) of different sizes which are obtained as the crushed materials.

The SUS-based material contains 50% by mass or more of iron and 10% by mass or more of chromium with respect to the total metal elements contained in the particles.

The aluminum-based material contains 60% by mass or more of aluminum with respect to the total metal elements contained in the particles.

Among the calcium compounds sieved and recovered, the components that react with the halogens are water-soluble, and thus the halogens can be removed from the calcium compounds by washing with water. The halogen-removed calcium compounds can be reused as a calcium compound at the time of carbonization, and can also be used as the copper feed.

EXAMPLES

Hereinafter, examples of the present invention and comparative examples will be described together.

The concentrations of copper, iron, and aluminum contained in the recovered material were measured by using ICP-AES after dissolving the recovered material in aqua regia. The Br concentration inside a water trap solution and a washing solution of the powder in the subsequent stage of the rotary kiln was measured by using ion chromatography (IC), and the Br concentration remaining in the powder after washing was measured by using XRF. Based on these Br concentrations, the bromine removal rate (%) was determined by the following expression (1). The Fe recovery rate of the SUS feed was determined by the following expression (2). The Al recovery rate of the Al feed was determined by the following expression (3). The weight reduction rate (%) was determined by the following expression (4).

[Br removal rate (%)]=[amount of Br in washing solution of Ca compound]/[total amount of Br in electronic board]×100  (1)

[Fe recovery rate (%)]=[amount of Fe in recovered SUS feed]/[total amount of Fe in electronic board]×100  (2)

[Al recovery rate (%)]=[amount of Al in recovered Al feed]/[total amount of Al in electronic board]×100  (3)

[weight reduction rate (%)]=[reduction amount of weight of electronic board after treatment]/[weight of electronic board before treatment]×100  (4)

Example 1

The slaked lime was added to one (257 g) waste printed circuit board (waste printed circuit board) such that a weight ratio of the waste printed circuit board and the slaked lime was 1:1, and the waste printed circuit board with the slaked lime was put in the electronic externally heated rotary kiln and heated to 600° C. for 1 hour in the nitrogen atmosphere and to be subjected to the carbonization treatment. The combustible gas containing HBr generated during the carbonization treatment was treated in a secondary combustion furnace at 800° C. after trapping Br with a water trap in the subsequent stage of the kiln. After the carbonization, it was confirmed that the inside of the rotary kiln was cooled to 60° C. or lower, and the carbonized treated material was extracted.

The obtained treated material was input in the vibrating sieve having a two-stage sieve having a sieve mesh of 50 mm and 0.5 mm, and the board piece on a 50 mm sieve, the mounted part on a 0.5 mm sieve, and the powder under a 0.5 mm sieve were obtained.

The mounted part on a 0.5 mm sieve was recovered, the magnetized material was sorted by magnetic force sorting using a magnet having a magnetic flux density of 2000 G, and a white metal was further sorted by color sorting. The material from which the magnetized material and the white metal were removed was recovered as a sorted mounted part.

The powder under a 0.5 mm sieve was stirred and washed for 30 minutes by adding pure water having a weight 10 times the weight of the powder, the washing solution was filtered, and then the same amount of pure water was added to perform cake washing. The powder after washing was dried at 105° C. for 24 hours and recovered.

The board piece on a 50 mm sieve was defined as a recovered material A, the magnetized material was defined as a recovered material B, the white metal for color sorting was defined as a recovered material C, the sorted mounted part other than the recovered material B and the recovered material C was defined as a recovered material D, and the powder after washing and drying was defined as a recovered material E. After acid-dissolving each of these recovered materials A to E, the Cu concentration, the Fe concentration, and the Al concentration were measured by using ICP-AES, and the recovery rate and grade of each element were obtained. The obtained results are shown in Table 1. In Table 1, the copper feed is the recovered material A, the recovered material D, and the recovered material E, the SUS feed is the recovered material B, and the Al feed is the recovered material C.

Examples 2 to 7

The weight reduction rate, the recovery rate, the grade, and the Br removal rate were obtained in the same manner as in Example 1 except that the carbonization temperature, the atmosphere, and the addition amount of the slaked limes (board: slaked lime weight ratio) were changed as shown in Table 1. The obtained results are shown in Table 1.

Comparative Examples 1 to 3

The weight reduction rate, the recovery rate, the grade, and the Br removal rate were obtained in the same manner as in Example 1 except that the carbonization temperature, the atmosphere, and the addition amount of the slaked limes (board: slaked lime weight ratio) were changed as shown in Table 1. The obtained results are shown in Table 1.

Comparative Example 4

5 kg of the waste printed circuit board was put into a continuous rotary kiln and heated to 1200° C. for 1 hour in an air atmosphere to be subjected to the melting treatment. The melt of the electronic board after the melting treatment was allowed to flow into water from the outlet portion of the kiln and rapidly cooled. The treated material after cooling was dried at 105° C. for 24 hours to obtain a recovered material F. The recovered material F was finely pulverized by using a hammer crusher, then acid-dissolved, and the Cu concentration, the Fe concentration, and the Al concentration were measured, respectively, by using ICP-AES and the recovery rate and the grade of Cu were obtained. The obtained results are shown in Table 1.

The Fe grade and the Al grade of the copper feed of Examples 1 to 7 are both 0.9% or less, most of which are 0.5% or less, and the copper feed containing less iron and aluminum can be obtained. On the other hand, the Fe recovery rate of the SUS feed is 90% or more, the Al recovery rate of the Al feed is almost 90% or more, and a high recovery rate can be obtained for iron and aluminum.

Further, as shown in Examples 1 to 3, in a case in which the carbonization temperature is high, the solder melts sufficiently and the mounted parts are easily separated, the sorting efficiency is improved, and the board resin is further thermally decomposed, so that the weight reduction rate is increased. As shown in Example 4, the treatment effect similar to that of the nitrogen atmosphere can be obtained even in the superheated steam atmosphere. On the other hand, as shown in Examples 5 to 7, in a case in which the addition amount of the slaked limes during carbonizing is reduced, there is a board portion that is not covered with the slaked lime, and the removal rate of Br is lowered. Therefore, the addition amount of the slaked limes is preferably 1:0.05 or more with respect to the weight of the board, and in a case in which the addition amount thereof is 1:0.5 or more, the Br removal rate is 80% or more.

On the other hand, in Comparative Examples 1, 2 and 4, the Fe grade of the copper feed was 3% or more, the Al grade thereof was 1.8% or more, and the amounts of iron and aluminum were much more than those of Examples 1 to 7. Further, as shown in Comparative Example 1, in a case in which the carbonization temperature is too low, the solder does not melt, so that the separation effect of the mounted parts is lowered and the thermal decomposition of the resin is not sufficient. Further, as shown in Comparative Example 2, in a case in which the carbonization temperature reaches 700° C., the melting point (660° C.) of aluminum is exceeded, so that aluminum melts and the separation effect of the mounted parts is lowered, and the Fe grade and the Al grade of the copper feed are increased, and the Fe recovery rate of the SUS feed and the Al recovery rate of the Al feed are significantly lowered. Further, as shown in Comparative Example 3, Br cannot be fixed unless the slaked lime is added at the time of carbonization, so that the Br removal rate is 19% and most of Br is gasified. Further, as shown in Comparative Example 4, iron and aluminum cannot be separated from the electronic board by the treating method in the related art in which heating and melting are performed at 1200° C. in the air atmosphere.

TABLE 1

| | Temperature (° C.) | Atmosphere | Slaked lime weight ratio | Weight reduction rate (%) | Recovered material | | | | | |
|---|---|---|---|---|---|---|---|---|---|---|
| | | | | | Copper feed | | | SUS feed | Al feed | |
| | | | | | Cu recovery rate (%) | Fe grade (%) | Al grade (%) | Fe recovery rate (%) | Al recovery rate (%) | Br removal rate (%) |
| Example 1 | 600 | N₂ | 1:1 | 17.8 | 93.7 | 0.11 | 0.32 | 97.5 | 89.2 | 87.2 |
| Example 2 | 500 | N₂ | 1:1 | 14.2 | 91.7 | 0.22 | 0.84 | 96.1 | 91.6 | 89.9 |
| Example 3 | 400 | N₂ | 1:1 | 11.6 | 94.6 | 0.13 | 0.25 | 94.7 | 93.3 | 90.7 |
| Example 4 | 600 | Superheated steam | 1:1 | 17.3 | 90.2 | 0.18 | 0.34 | 97.6 | 92.1 | 90.5 |
| Example 5 | 600 | N₂ | 1:0.5 | 17.9 | 92.3 | 0.31 | 0.37 | 94.5 | 93.5 | 81.6 |
| Example 6 | 600 | N₂ | 1:0.1 | 17.1 | 89.6 | 0.44 | 0.54 | 98.3 | 94.6 | 77.3 |
| Example 7 | 600 | N₂ | 1:0.05 | 17.6 | 83.7 | 0.43 | 0.75 | 91.5 | 90.5 | 67.4 |
| Comparative Example 1 | 350 | N₂ | 1:1 | 5.3 | 98.9 | 5.74 | 1.84 | 8.1 | 11.4 | 74.3 |
| Comparative Example 2 | 700 | N₂ | 1:1 | 18.0 | 91.4 | 3.19 | 4.69 | 41.9 | 3.1 | 85.1 |
| Comparative Example 3 | 600 | N₂ | — | 17.2 | 93.2 | 0.36 | 0.17 | 98.1 | 94.5 | 19.2 |
| Comparative Example 4 | 1200 | Air atmosphere | — | 20.2 | 100 | 10.38 | 7.36 | — | — | — |

(Note)
The slaked lime weight ratio is an addition weight ratio of the slaked limes to the board (board: slaked lime), and no slaked lime is added in Comparative Examples 3 and 4.

INDUSTRIAL APPLICABILITY

Generation of the harmful halogen-containing gas can be avoided, the combustibles or the halogens can be removed without causing environmental pollution, and a metal such as aluminum and SUS that adversely affect the copper refining process can be separated to use the treated material of the waste printed circuit board as the copper feed.

What is claimed is:

1. A method for treating waste printed circuit board, the method comprising:
   carbonizing waste printed circuit board together with a calcium compound at 400° C. to 600° C. in a non-oxidizing atmosphere to fix a halogen contained in the board as calcium halide and to melt a solder of the board to allow mounted parts to be easily separated from the board;
   performing crushing after the carbonizing; and
   sieving crushed materials into fine particles of less than 0.5 mm containing the calcium compounds, medium particles containing the mounted parts, and coarse particles containing board pieces such that the crushed materials are sorted into the calcium compounds, the mounted parts, and the board pieces;
   wherein
   the crushed materials are sieved into the fine particles of less than 0.5 mm containing the calcium compounds, medium particles of 0.5 mm or more and 50 mm or less containing the mounted parts, and coarse particles of more than 50 mm containing the board pieces.

2. The method for treating waste printed circuit board according to claim 1, further comprising:
   physically sorting the medium particles containing the mounted parts by any one of magnetic force sorting, eddy current sorting, and color sorting or a combination thereof into a SUS-based material and an aluminum-based material.

3. The method for treating waste printed circuit board according to claim 1, wherein
   after washing the fine particles containing the calcium compounds with water to remove the halogen, the fine particles are reused as the calcium compounds during carbonizing or used as a copper feed.

4. The method for treating waste printed circuit board according to claim 1, wherein
   a remaining material excluding a SUS-based material and an aluminum-based material sorted by physical sorting of the medium particles containing the mounted parts is used as a copper feed.

* * * * *